United States Patent
Tsushima

(10) Patent No.: US 7,035,610 B2
(45) Date of Patent: Apr. 25, 2006

(54) AGC CIRCUIT OF RECEIVER USING SEVERAL LOCAL OSCILLATION FREQUENCIES

(75) Inventor: Masahiro Tsushima, Kawagoe (JP)

(73) Assignee: Pioneer Corporation, Tokyo (JP)

( * ) Notice: Subject to any disclaimer, the term of this patent is extended or adjusted under 35 U.S.C. 154(b) by 439 days.

(21) Appl. No.: 10/252,373

(22) Filed: Sep. 24, 2002

(65) Prior Publication Data

US 2003/0153291 A1 Aug. 14, 2003

(30) Foreign Application Priority Data

Feb. 8, 2002 (JP) .............................. 2002-031730

(51) Int. Cl.
*H04B 1/06* (2006.01)

(52) U.S. Cl. .............................. 455/240.1; 455/232.1; 455/234.1; 375/345; 330/278

(58) Field of Classification Search ............ 455/200.1, 455/232.1, 239.1–250.1, 255, 258, 260, 219, 455/136, 127.2, 285, 293, 296, 313, 191.3, 455/180.3, 182.1, 183.1, 138, 147, 575.1, 455/550.1, 561, 67.13, 249.1, 234.1; 330/129, 330/140, 141.52, 278, 131, 239, 279, 281, 330/132, 245, 257, 288, 141; 375/317, 319, 375/345, 346, 350, 324, 340, 279–281, 329–332, 375/284, 283, 316

See application file for complete search history.

(56) References Cited

U.S. PATENT DOCUMENTS

| | | | | |
|---|---|---|---|---|
| 4,455,681 A * | 6/1984 | Wile | ....................... | 455/243.1 |
| 5,465,408 A * | 11/1995 | Sugayama et al. | ....... | 455/249.1 |
| 5,617,060 A * | 4/1997 | Wilson et al. | .............. | 330/129 |
| 5,668,839 A * | 9/1997 | Bernasconi et al. | ........ | 375/347 |
| 6,434,374 B1 * | 8/2002 | Muterspaugh | ........... | 455/234.1 |
| 6,529,718 B1 * | 3/2003 | Takashima | ................... | 455/254 |
| 6,577,688 B1 * | 6/2003 | Nease | ........................ | 375/350 |
| 2004/0153879 A1 * | 8/2004 | Fukutani et al. | .............. | 714/48 |
| 2005/0032495 A1 * | 2/2005 | Stalf et al. | ............... | 455/232.1 |

* cited by examiner

*Primary Examiner*—Edward F Urban
*Assistant Examiner*—Charles Chow
(74) *Attorney, Agent, or Firm*—Drinker Biddle & Reath LLP

(57) ABSTRACT

An AGC circuit maintains a fixed level for starting AGC operation for an interference wave even if the local oscillation frequency is switched in a receiver that has a plurality of local oscillation frequencies. A frequency correction circuit for correcting the conversion gain characteristic from the antenna input up to the mixer output is provided for the input of a detector within the AGC control loop. The frequency correction circuit is provided with a trap circuit that has a fixed trap frequency by using an LC resonance circuit, for example.

11 Claims, 10 Drawing Sheets

INTERMEDIATE FREQUENCY SIGNAL SPECTRUM WHEN FREQUENCY CONVERSION IS PERFORMED USING LOWER LOCAL OSCILLATION FREQUENCY F1

FREQUENCY CHARACTERISTIC OF CONVERSION GAIN G(F)

AGC CIRCUIT OF RECEIVER USING SEVERAL LOCAL OSCILLATION FREQUENCIES

BACKGROUND OF THE INVENTION

1. Field of the Invention

The present invention relates to an automatic gain control (AGC) circuit of a receiver that includes a mixer for selectively using two or more local oscillation frequencies to perform frequency conversion.

2. Description of the Related Art

FIG. 1 shows a circuit configuration of a portion of the front end of a conventional receiver, that includes a mixer circuit and an AGC circuit.

In FIG. 1, a reception signal with frequency fr received at an antenna 1 is supplied to a mixer 3 via a gain control circuit 2. Meanwhile, a local oscillation frequency signal with frequency fl is supplied to the mixer 3 from a local oscillation circuit 4.

The mixer 3, which comprises a double balanced modulator or a ring modulator that uses diodes or transistors, for example, generates an intermediate frequency signal having frequency components of the sum and difference of the frequencies of both signals, namely |fr±fl|. In other words, the reception signal frequency is converted to an intermediate frequency suitable for the subsequent demodulation/reproduction processing by passing through the mixer 3.

The intermediate frequency signal that is output from the mixer 3 is supplied to a demodulation/reproduction circuit 7 in the subsequent stage and also to a detector 5. The detector 5 detects the supplied intermediate frequency signal, detects its signal level, and outputs the relevant signal level to an AGC control circuit 6. The AGC control circuit 6 controls the start of the execution of AGC operation in the gain control circuit 2 according to the relevant signal level.

By performing this kind of feedback control, the output signal level from the mixer 3 can be maintained at a prescribed value even if the signal level of the reception signal fluctuates due to variations in the reception electric field intensity.

Incidentally, the radio waves from the antenna 1 include various interference waves, not just the desired waves that are to be received. For example, if a signal that is modulated according to the orthogonal frequency division multiplexing (OFDM) method (hereafter, referred to simply as an "OFDM modulation signal") is received as an interference wave as shown in FIG. 2A, the following kind of problem occurs. More specifically, the OFDM modulation method uses a so-called multi-carrier method in which a plurality of carriers with several different frequencies are arrayed in the band. Consequently, if the signal level of the OFDM modulation signal that is the interference wave grows to a certain degree, an intermodulation distortion that occurs between the carriers will increase as shown in FIG. 2B. As a result, its frequency spectrum may spread to the frequency band of a desired wave, which may hinder the reception of the desired wave. Therefore, the concept of a so-called broadband AGC has been introduced in the AGC control scheme described earlier, and a method has been used that attends not just to the signal level of the desired wave but also to the signal level of the interference wave in order to attenuate the input signal level of the interference wave by using the gain control circuit 2.

However, in a receiver that has two local oscillation frequencies, for example, and that switches between these frequencies, the following kind of problem will occur. The intermediate frequency that is generated by the mixer 3 when the reception signal is frequency converted by using the local oscillation frequency fl and the intermediate frequency that is generated when it is frequency converted by using the local oscillation frequency fu will naturally differ.

Now, assume that the intermediate frequency of the frequency spectrum of an OFDM modulation signal that is the interference wave from antenna 1 is fi and that the input level is $\chi$ dBm. Also, let G(f) dB be the detector 5 input from antenna 1 in frequency f, that is, the conversion gain up to the mixer 3 output. In this case, the input signal level Ll to the detector 5 of the interference wave that was frequency converted by using local oscillation frequency fl will be as follows.

$$Ll = G(|fi-fl|) + X \text{ dBm}$$

On the other hand, the input signal level Lu to the detector 5 of the interference wave that is frequency converted by using local oscillation frequency fu will be as follows.

$$Lu = G(|fi-fu|) + X \text{ dBm}$$

Since the conversion gain G(f) up to the mixer 3 output from the antenna 1 generally has a frequency characteristic, the values of G(|fi−fl|) and G(|fi−fu|) in the above equations will differ. Therefore, the following inequality holds:

$$Ll \neq Lu$$

and the signal level of the interference wave that is input to the detector 5 when the interference wave fi is frequency converted by using fl will differ from the signal level when fi is frequency converted by using fu.

Therefore, if a setting is required for starting AGC operation according to gain control circuit 2 when the antenna input of the interference wave exceeds $\chi$ dBm, for example, then if the relevant setting is made by using the input signal level Ll to the detector 5 when frequency conversion is performed by using fl, for example, the AGC will not operate even if the antenna input of the interference wave exceeds $\chi$ dBm when frequency conversion is performed by using fu.

As a result, a problem occurs that, when the user changes a reception channel for which local oscillation frequency switching is required, the broadcast that could be received up to then because AGC operated will not be able to be received.

OBJECTS AND SUMMARY OF THE INVENTION

An object of the present invention is to solve the kind of problem described above, and to provide an AGC of a receiver that has a plurality of local oscillation frequencies circuit, that maintains a fixed level for starting AGC operation for an interference wave even if the local oscillation frequency is switched.

The present invention pertains to an AGC circuit of a receiver that selectively uses a plurality of local oscillation frequencies, comprising a gain control circuit for controlling a gain for a reception signal from an antenna based on a gain control signal, a mixer circuit for multiplying an output signal from the gain control circuit by a fixed local oscillation frequency signal to perform frequency conversion of the output signal, local oscillation circuits for generating local oscillation frequency signals of at least two different frequencies and supplying one of those local oscillation frequency signals to the mixer circuit, a frequency characteristic correction circuit connected to an output end of the mixer circuit for correcting the frequency characteristic in the mixer circuit output in a prescribed frequency band, a detection signal generation circuit for generating a detection signal representing a signal level of a signal that has passed through the frequency characteristic correction circuit, and a gain control signal generation circuit for generating the gain control signal based on the detection signal and supplying it to the gain control circuit.

DETAILED DESCRIPTION OF THE PREFERRED EMBODIMENT

Figure 1:
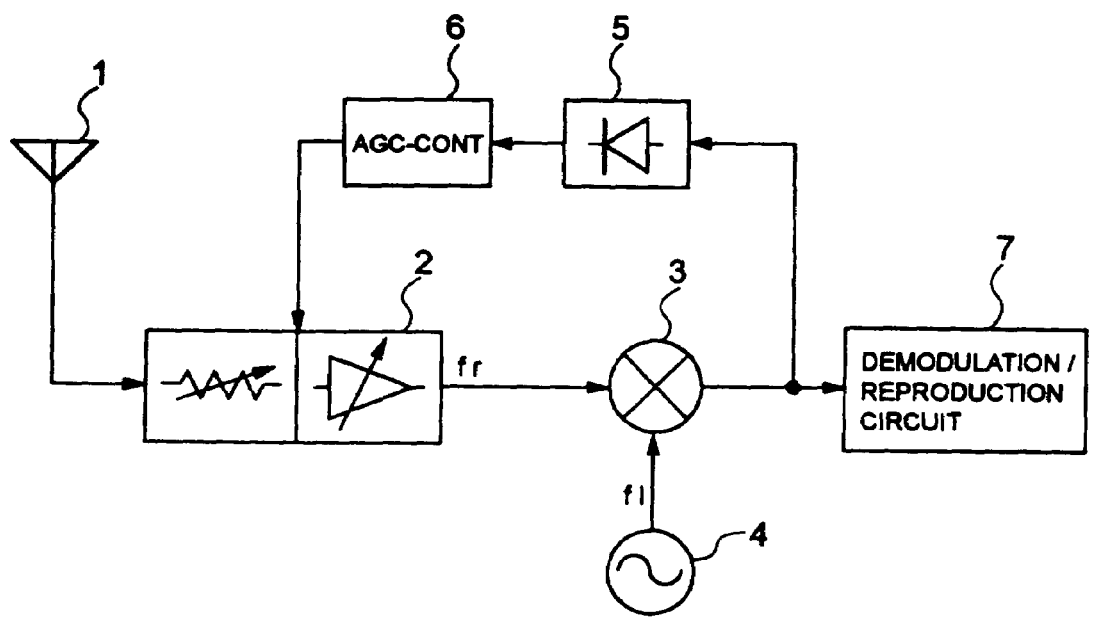
FIG. 1 is a block diagram showing the configuration of the front end of a conventional receiver.
Figure 2A:
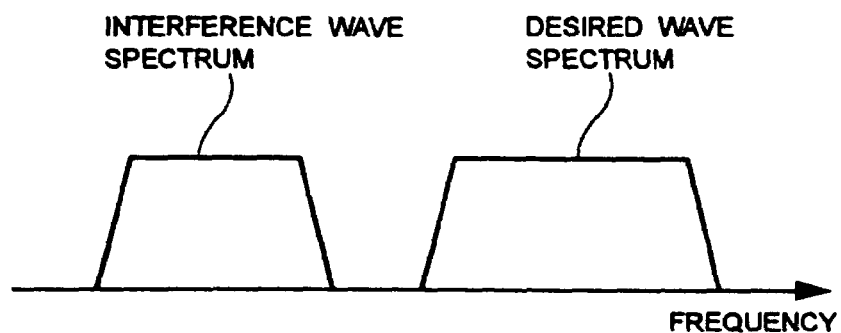
FIGS. 2A to 2C are diagrams showing situations in which an OFDM modulated interference wave affects the desired wave.
Figure 2B:
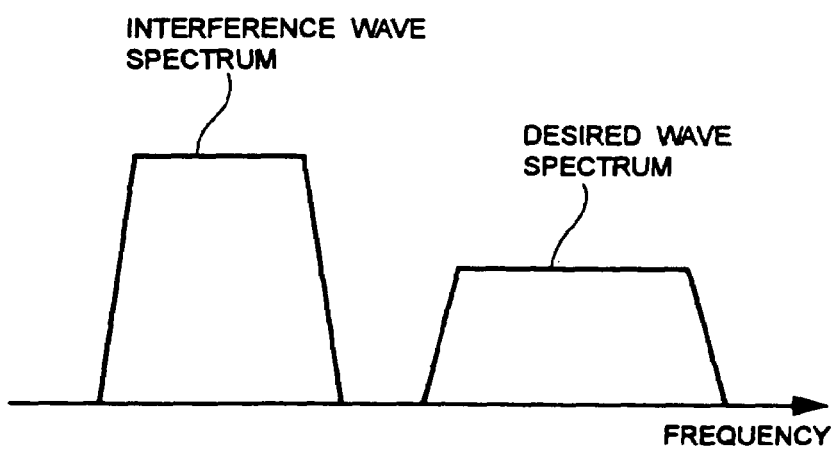
Figure 2C:
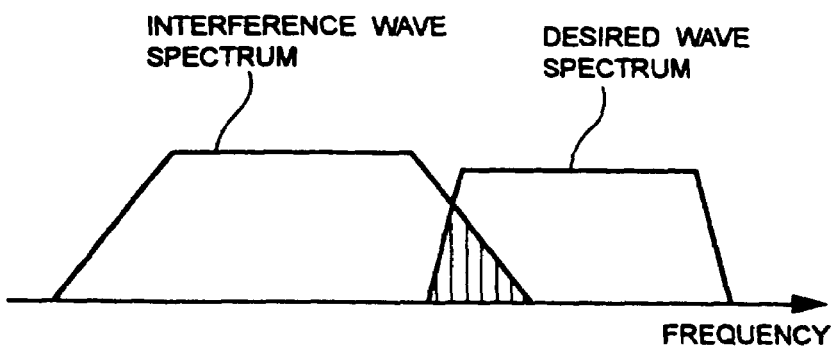
Figure 3:
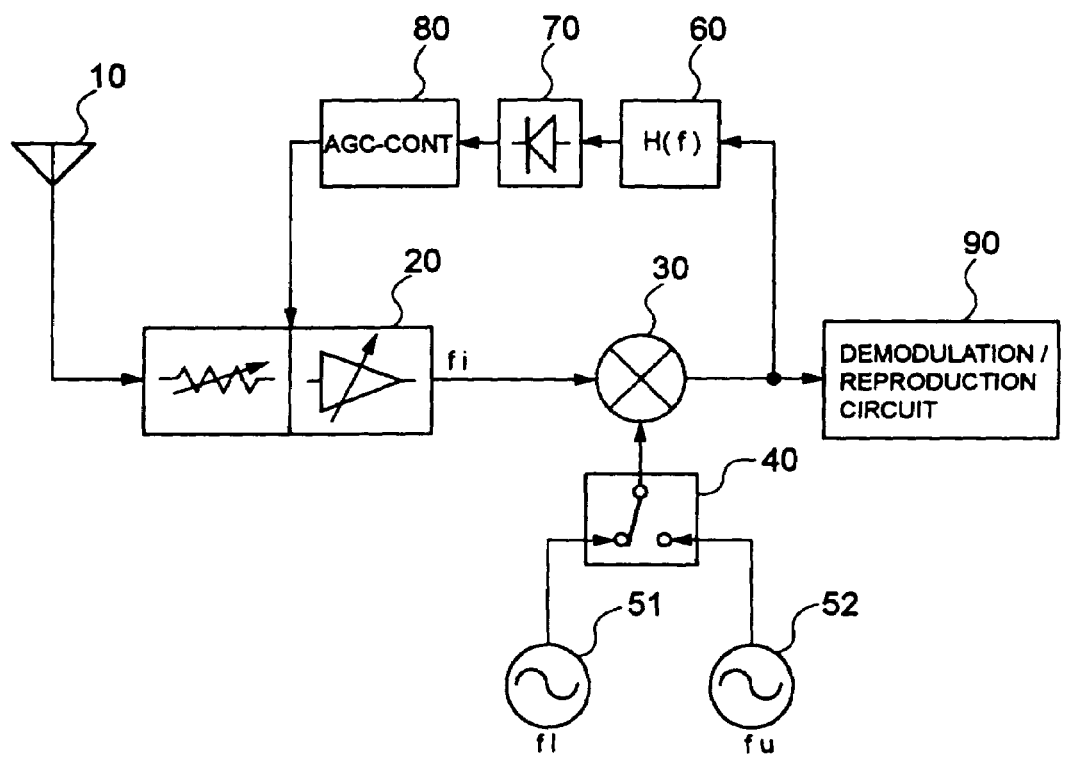
FIG. 3 is a block diagram showing a first embodiment of the AGC circuit of the present invention.

The block diagram in FIG. 3 shows a first embodiment of the AGC circuit of the present invention.

In FIG. 3, a reception signal that is received at an antenna 10 is supplied to a mixer 30 via a gain control circuit 20. Meanwhile, local oscillation frequency signals having different frequencies fl and fu are selectively supplied from two local oscillation circuits 51 and 52, respectively, to the mixer 30 via a signal switching circuit 40. The switching between the supplied local oscillation frequency signals is performed automatically when the user switches the channel of the desired wave to be received.

The mixer 30, which is constituted by a double balanced modulator or a ring modulator that uses diodes or transistors, for example, generates an intermediate frequency signal that takes as its frequency the difference of the frequencies of the reception signal and the local oscillation frequency signal. More specifically, the reception signal frequency is converted to an intermediate frequency suitable for the subsequent demodulation/reproduction processing by passing through the mixer 30.

The intermediate signal output from the mixer 30 is supplied to a demodulation/reproduction circuit 90 in the subsequent stage and also to a compensation circuit 60. The compensation circuit 60 is constituted by a so-called frequency trap circuit that uses the resonance of a series branch comprising inductor L and capacitor C shown in FIG. 4, for example. This kind of frequency trap circuit shows a large attenuation characteristic for the input signal only at the resonance frequency of the LC series branch in the circuit. Therefore, a desired frequency characteristic can be set by appropriately controlling the circuit constants that constitute the LC series branch. In the present embodiment, as an ideal example, frequency characteristic H(f), which is the inverse characteristic of the frequency characteristic G(f) from antenna 10 up to the mixer 30 output within a prescribed frequency band, is set for compensation circuit 60. In other words, within a prescribed frequency band, the following relationship holds between frequency characteristics G(f) and H(f).

$$G(f)+H(f)=A \text{ dB}$$

(where A is a fixed gain or attenuation regardless of the frequency)

Now, it is sufficient that the compensation circuit 60 provides a function to make the signal level when an interference wave signal having a prescribed frequency or frequency band is frequency converted in the mixer 30 by using the local oscillation frequency fl the same as the signal level when the interference wave signal is frequency converted by using local oscillation frequency fu. Consequently, if fi is taken for the intermediate frequency of the frequency or frequency band of the interference wave, then the frequency characteristic H(f) that is set by the compensation circuit 60 need not have the inverse characteristic of frequency characteristic G(f) over the entire frequency band from |fi−fl| to |fi−fu|.

On the other hand, the output signal from the compensation circuit 60 is supplied to a detector 70 where its signal level is detected. The detector 70 outputs the detected signal level value to the next AGC control circuit 80. The AGC control circuit 80 controls the start of AGC operation for gain control circuit 20 based on the detected value of the supplied signal level.

The operation of the present embodiment is explained below using a so-called XM broadcast receiver as an example. Incidentally, XM broadcasting, which currently is a satellite digital audio broadcasting system that is implemented in North America, is generally called XM radio. XM radio uses the radio waves of both terrestrial waves and satellite waves to broadcast audio and data services that use the so-called S band, which is the 2.3 GHz band.

Figure 5:
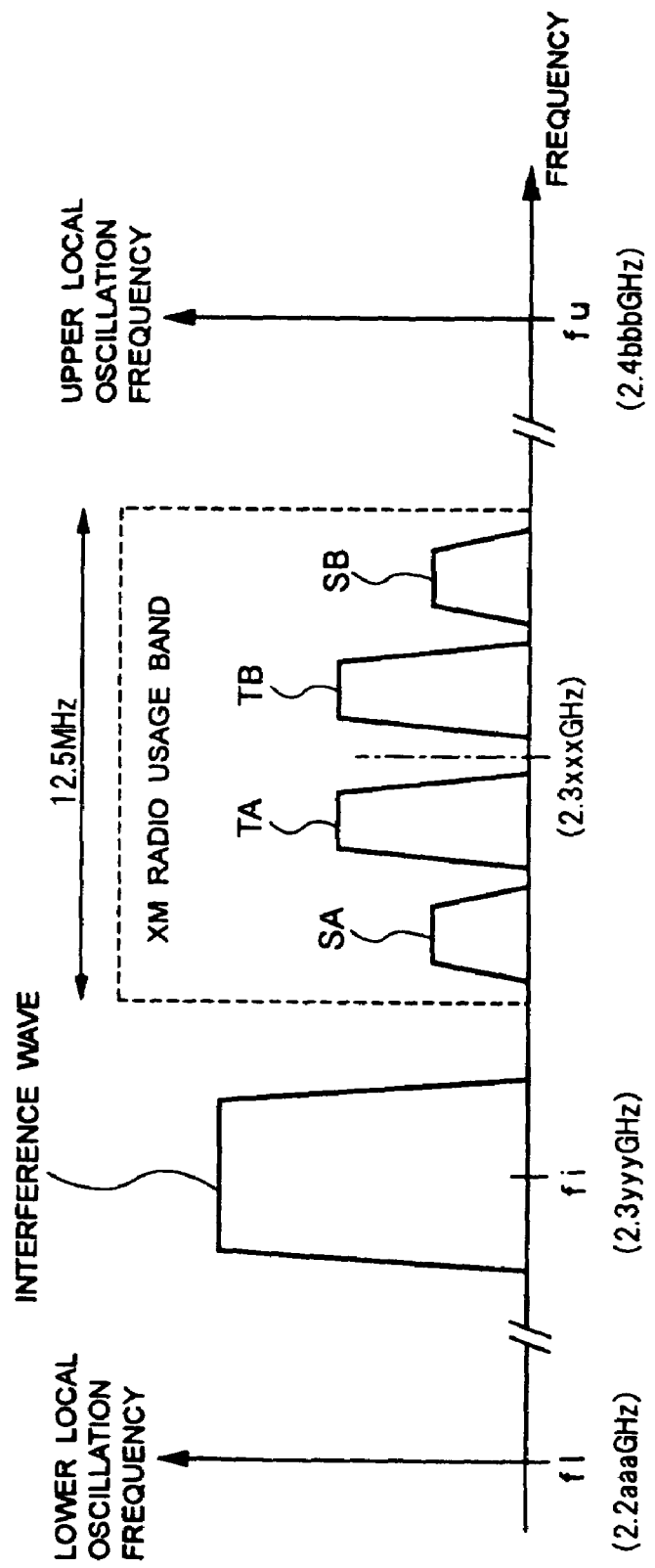
FIG. 5 is a diagram showing the state of the frequency spectrum of transmission signals in an XM broadcast.

FIG. 5 shows the frequency spectrum of the transmission signals in XM radio. In FIG. 5, fl and fu indicate the lower local oscillation frequency and upper local oscillation frequency, respectively, in the receiver. Also, SA, TA, TB, and SB represent the various frequency spectra of the A channel signal due to satellite waves, A channel signal due to terrestrial waves, B channel signal due to terrestrial waves, and B channel signal due to satellite waves, respectively. The A channel signal includes programs for channels 1 to 50, for example, and the B channel signal includes programs for channels 51 to 100, for example. Satellite waves and terrestrial waves each transmit the same signals by using different modulation methods.

In addition, fi in FIG. 5 represents the intermediate frequency of the interference wave spectrum. This embodiment assumes that the signal from the Sirius Broadcast system, which is actually operating, is the relevant interference wave. Since the technical feature of the Sirius Broadcast system is equivalent to that of the above-mentioned XM radio, its explanation is omitted.

Figure 6:
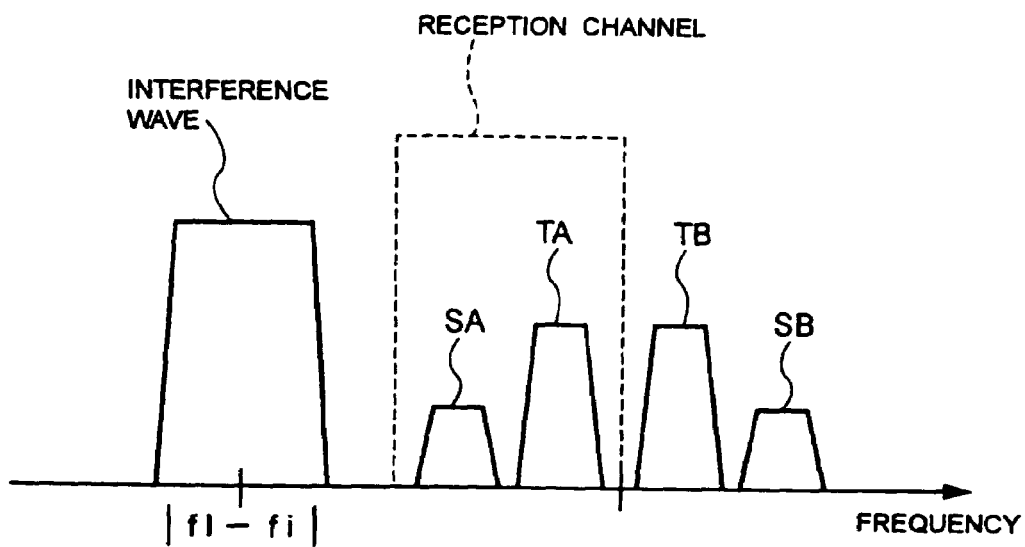
FIG. 6 is a diagram showing the frequency spectrum of the intermediate frequency signal when the lower local oscillation frequency fl is used to perform frequency conversion of the XM broadcast signal in FIG. 5.

The A channel and B channel spectra within the signal spectrum due to XM radio are symmetrically arranged to the left and right of the boundary indicated by the intermediate frequency of the usage band as shown in FIG. 5. When the user selects a program included in the A channel, the receiver performs reception processing by frequency converting satellite wave SA and terrestrial wave TA signals using the lower local oscillation frequency fl. On the other hand, when the user selects a program included in the B channel, frequency conversion of the satellite wave SB and terrestrial wave TB signals is performed using the upper local oscillation frequency fu. FIG. 6 shows the intermediate wave signal spectrum when the low-pass oscillation frequency fl is used to perform frequency conversion, and FIG. 7 shows the intermediate wave signal spectrum when the high-pass oscillation frequency fu is used to perform frequency conversion.

The Sirius Broadcast system, which is assumed to be the interference wave in the present embodiment, uses the OFDM modulation method as the signal modulation method. Consequently, to increase the anti-interference characteristic against interference from the Sirius Broadcast system in the receiver, the input signal level of the interference wave should be reduced by AGC operation in gain control circuit 20. Therefore, it is tentatively decided that when the input signal level of the interference wave exceeds $\chi$ dBm, for example, in the antenna input, the AGC operation will be started in the gain control circuit 20 to reduce the input signal level of the interference wave.

Figure 7:
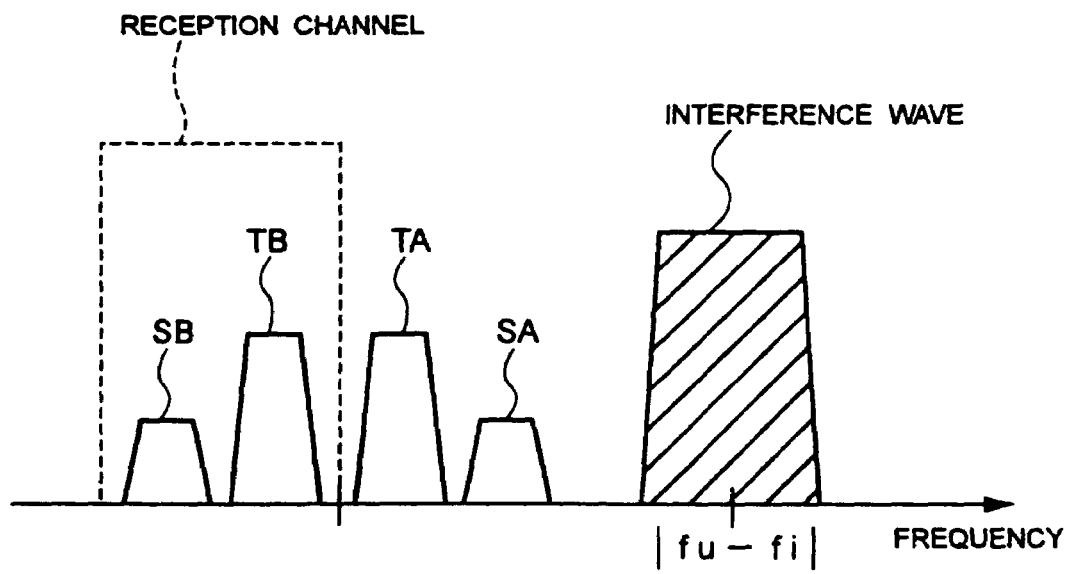
FIG. 7 is a diagram showing the frequency spectrum of the intermediate frequency signal when the upper local oscillation frequency fu is used to perform frequency conversion of the XM broadcast signal in FIG. 5.

However, when the interference wave is frequency converted according to fl or fu as shown in FIG. 6 or 7, respectively, the frequency spectrum of the interference wave appears at |fl−fi| or |fu−fi|, respectively, if only the intermediate frequency is noted.

Figure 8:
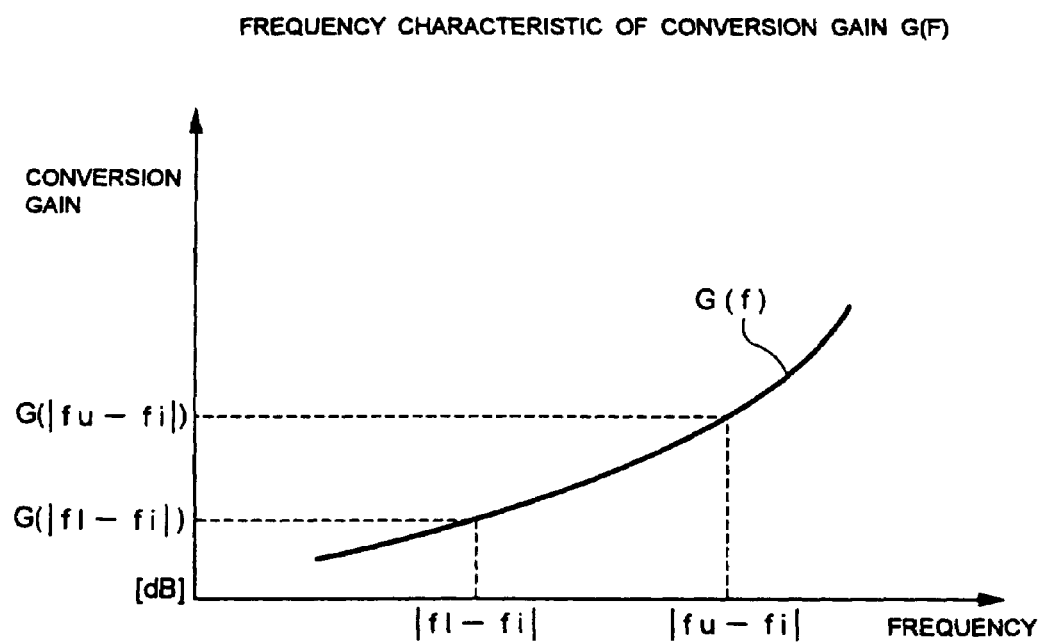
FIG. 8 is a diagram showing the conversion gain characteristic from antenna 10 up to the mixer circuit 30 output in the block diagram in FIG. 3.

Therefore, if the conversion gain from the antenna 10 up to the mixer circuit 30 output has the frequency characteristic G(f) as shown in FIG. 8, the conversion gains at each of the above-mentioned frequencies will be G(|fl− fi|) and G(|fu−fi|), respectively.

Since it is also clearly understood from FIG. 8 that the following relationship holds:

$$G(|fl-fi|) \text{ dB} < G(|fu-fi|) \text{ dB}$$

the relationship between the intermediate signal levels of the interference waves that were converted by using fl and fu is shown by the following expression.

$$G(|fl-fi|)+\chi \text{ dBm} < G(|fu-fi|)+\chi \text{ dBm}$$

In other words, if the AGC operation starting point is established on the basis of the case where frequency conversion is performed by using fu, then when the receiver performs frequency conversion by using fl, there is a risk that AGC operation will not be started even if the antenna input level of the interference wave reaches $\chi$ dBm.

The present invention provides the compensation circuit 60 for preventing this problem. As described earlier, the frequency characteristic H(f) of the compensation circuit 60 has a characteristic that corrects the frequency characteristic G(f) of the conversion gain from the antenna 10 input up to the mixer 30 output to a fixed value regardless of the frequency, within a prescribed frequency range. Needless to say, the above-mentioned frequency range from |fl-fi| to |fu−fi| is included in this prescribed frequency range.

Therefore, in the present embodiment, the conversion gain from the antenna 10 input up to the detector 70 via the compensation circuit 60 at each of the frequencies |fl−fi| and |fu−fi| will be:

$$G(|fl-fi|)+H(|fl-fi|)=A \text{ dB}$$

and $$G(|fu-fi|)+H(|fu-fi|)=A \text{ dB},$$

respectively. Incidentally, A is a value that indicates the fixed gain or attenuation regardless of the frequency.

In other words, in the present embodiment, the conversion gain from antenna 10 up to the detector 70 will be the value A dB regardless of whether frequency conversion is performed by using fl or fu. Since compensation circuit 60 consists only of passive elements L and C, H(f) will be an attenuation value, which will be a negative value relative to the gain G(f) in the above equations.

Since the present embodiment has the configuration as described in the above, when the input signal level of the interference wave at antenna 10 reaches $\chi$ dBm, which requires AGC control, the signal level of the interference wave that is input to detector 70 will be as follows.

First, the signal level Ll dBm when the lower local oscillation frequency fl is used to perform frequency conversion will be as follows.

$$Ll=G(|fl-fi|)+H(|fl-fi|)+\chi=A+\chi \text{ dBm}$$

On the other hand, the signal level Lu dBm when the upper local oscillation frequency fu is used to perform frequency conversion will be as follows.

$$Lu=G(|fu-fi|)+H(|fu-fi|)+\chi=A+\chi \text{ dBm}$$

Therefore, the following relationship holds:

$$Ll=Lu$$

and the signal level of the interference wave that is input to the detector 70 will be equal when frequency conversion is performed by using fl and when frequency conversion is performed by using fu.

Figure 9A:
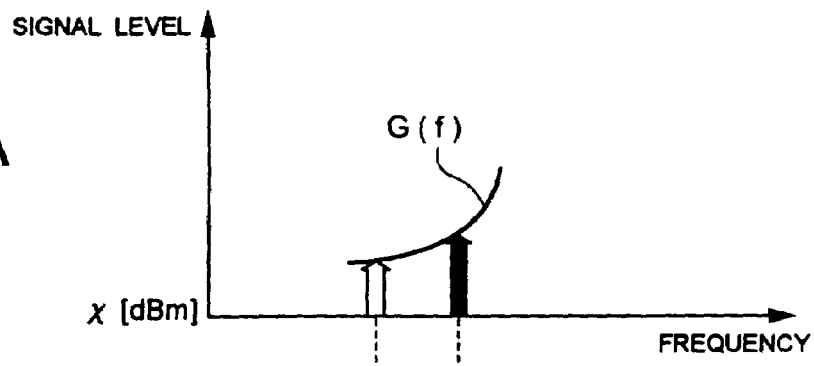
FIGS. 9A to 9C are diagrams showing a situation in which the signal level deviation of interference waves that were converted by using different local oscillation waves in the block diagram in FIG. 3 is corrected.
Figure 9B:
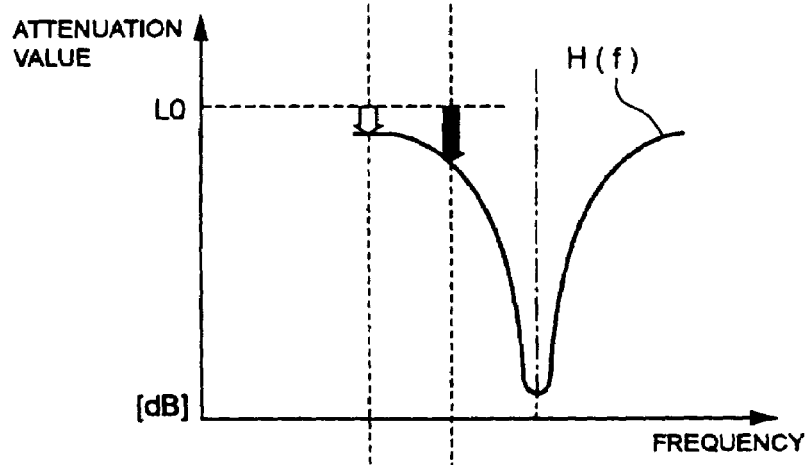
Figure 9C:
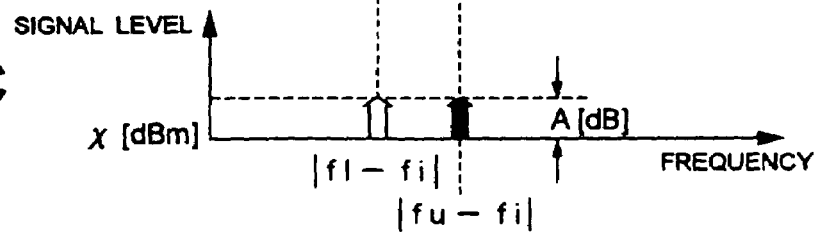

FIGS. 9A to 9C show the situation in which the signal level of the interference wave varies, which was explained above. FIG. 9A represents the output signal level of mixer 30, FIG. 9B represents the frequency characteristic in the compensation circuit 60, and FIG. 9C represents the signal level that is input to the detector 70. The frequency characteristic in compensation circuit 60 indicates the attenuation value from a prescribed signal level L0.

Next, a second embodiment of the AGC circuit according to the present invention will be described with reference to the block diagram shown in FIG. 10. In the configuration shown in FIG. 10, independent front ends are provided for radio terrestrial waves and satellite waves, respectively, in the XM broadcast receiver, but the operation principles are similar to those of the above-mentioned first embodiment.

Figure 10:
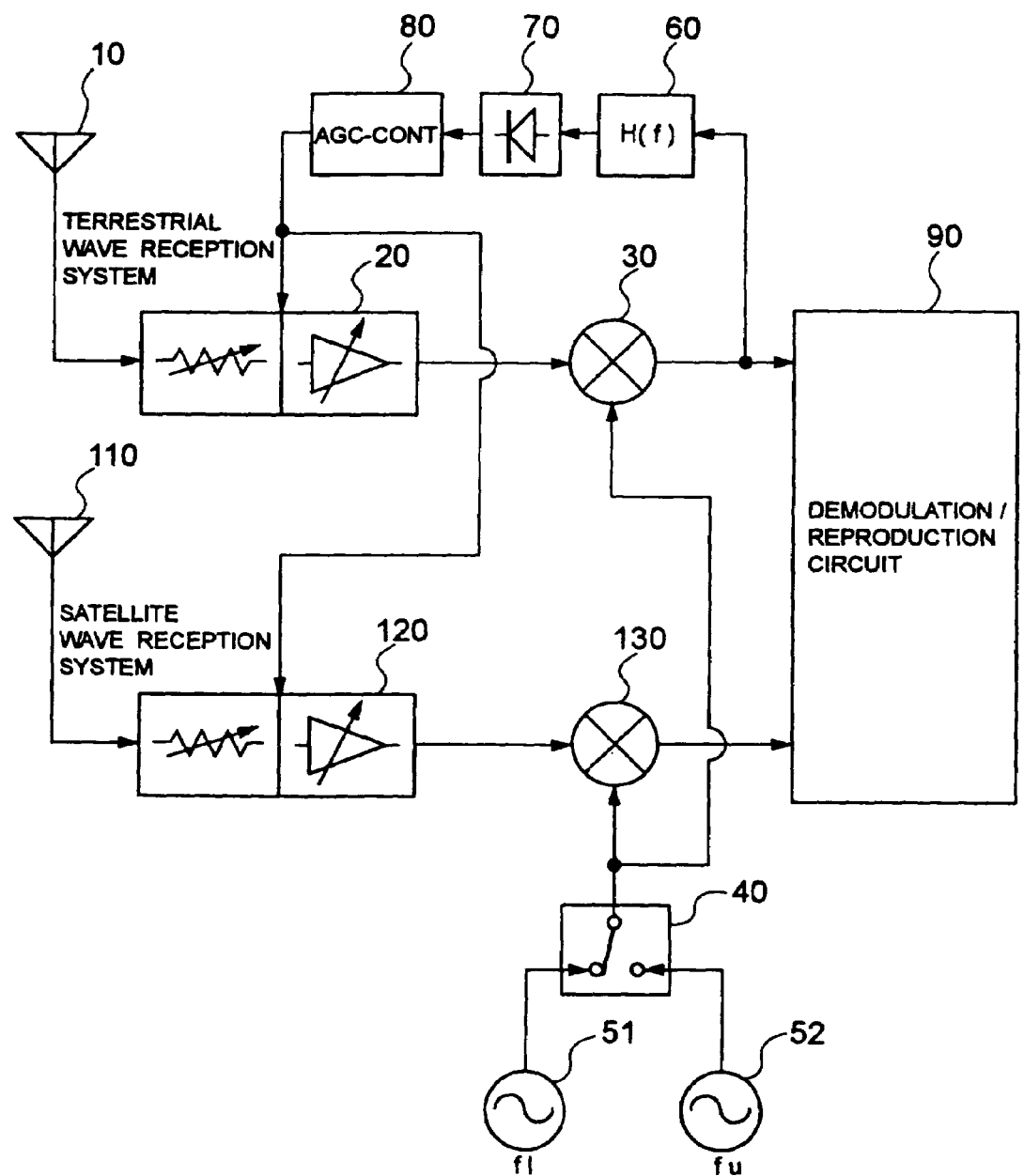
FIG. 10 is a block diagram showing a second embodiment of the AGC circuit of the present invention.

In FIG. 10, the reception signal of the terrestrial wave system supplied from the antenna 10 is supplied to the mixer 30 via the gain control circuit 20. Similarly, the reception signal of the satellite wave system that was input from an antenna 110 is supplied to a mixer 130 via gain control circuit 120.

Meanwhile, local oscillation frequency signals having different frequencies fl and fu are selectively supplied from two local oscillation circuits 51 and 52, respectively, to each of the mixer 30 and the mixer 130 via a signal switching circuit 40. The switching of the supplied local oscillation frequency signal is performed automatically when the user switches the channel of the desired wave to be received.

The mixer 30 and the mixer 130, each of which is constituted by a double balanced modulator or ring modulator that uses a diode or transistor, for example, generate intermediate frequency signals that take as their frequencies the differences of the frequencies of each reception signal and the local oscillation frequency signal. In other words, each reception signal frequency is converted to an intermediate frequency suitable for the subsequent demodulation/reproduction processing by passing through mixer 30 or mixer 130.

The intermediate signal that is output from the mixer 30 or the mixer 130 is supplied to the subsequent-stage demodulation/reproduction circuit 90.

Meanwhile, the intermediate signal that is output from mixer 30 is also supplied to the compensation circuit 60. Although AGC control is performed by using the intermediate frequency signal output from mixer 30 in the present embodiment, the present invention is not limited to this example, and an AGC control may also be performed by using the output from mixer 130.

Figure 4:
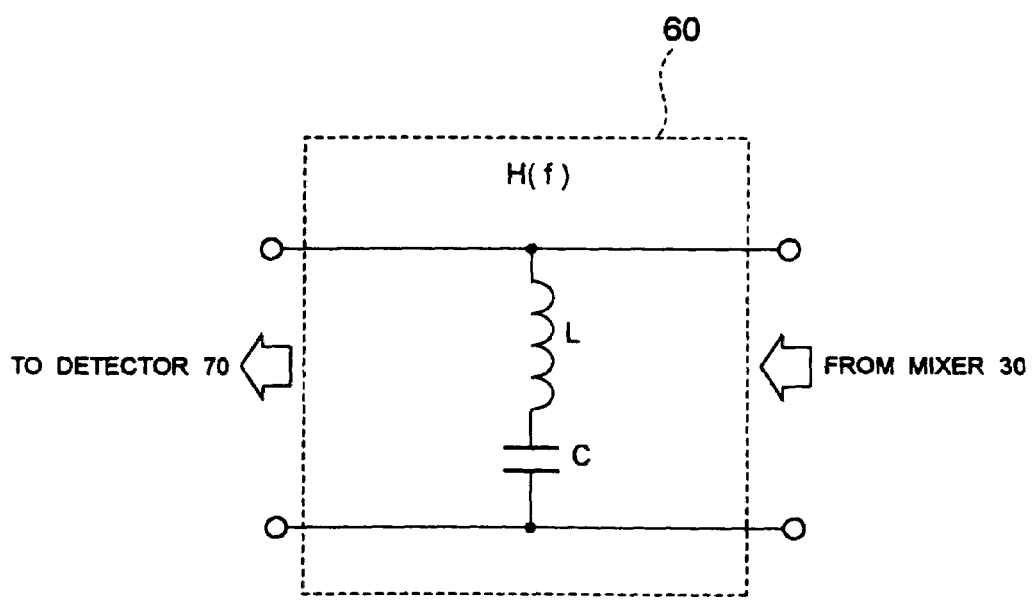
FIG. 4 is a circuit diagram showing the configuration of compensation circuit 60 in the block diagram in FIG. 3.

The compensation circuit 60 is constituted by a so-called frequency trap circuit that uses the resonance of a series branch comprising inductor L and capacitor C shown in FIG. 4, for example. This kind of frequency trap circuit shows a large attenuation characteristic for the input signal only at the resonance frequency of the LC series branch in the circuit. Therefore, a desired frequency characteristic can be set by appropriately controlling the circuit constants that constitute the LC series branch. In the present embodiment, as an ideal example, frequency characteristic H(f), which is the inverse characteristic of the frequency characteristic G(f) from antenna 10 up to detector 70 within a prescribed frequency band, is set for the compensation circuit 60. In other words, within a prescribed frequency band, the following relationship holds between frequency characteristics G(f) and H(f).

$$G(f)+H(f)=A \text{ dB}$$

(where A is a fixed gain or attenuation regardless of the frequency)

Now, it is sufficient if the compensation circuit 60 provides a function that makes the signal level when an interference wave signal having a prescribed frequency or frequency band is frequency converted in the mixer 30 by using local oscillation frequency fl the same as the signal level when the interference wave signal is frequency converted by using local oscillation frequency fu. Consequently, if fi is taken for the intermediate frequency of the frequency or frequency band of the interference wave, then the frequency characteristic H(f) that is set by the compensation circuit 60 need not have the inverse characteristic of frequency characteristic G(f) over the entire frequency band from |fi−fl| to |fi−fu|.

On the other hand, the output signal from the compensation circuit 60 is supplied to the detector 70, where its signal level is detected. The detector 70 in turn outputs the detected signal level value to the AGC control circuit 80. The AGC control circuit 80 starts AGC control for gain control circuit 20 and gain control circuit 120 based on the detected value of the relevant signal level.

Since the processing operations in the present embodiment are similar to those of the above-mentioned first embodiment, the explanation will not be repeated.

As explained above, according to the first and second embodiments, the starting point of AGC operation for interference waves can always be maintained constant without being affected by the switching of the local oscillation frequency in the receiver.

Although the embodiments have been explained above by using an XM broadcast receiver as an example, the present invention is not limited to this example. As long as the receiver selectively switches among two or more local oscillation frequencies in the mixer part, the present invention can be applied.

Also, although the above-mentioned embodiments used as the compensation circuit 60 a trap circuit having a configuration in which an LC series circuit is connected in parallel between the input and output as shown in FIG. 4, the present invention is not limited to this configuration. A trap circuit having a configuration in which an LC parallel circuit is connected in series between the input and output, for example, may also be used.

As described in detail above, the present invention can control the dispersion of the anti-interference characteristic that accompanies the switching of the local oscillation frequency in the receiver.

This application is based on Japanese Patent Application No. 2002-31730 which is herein incorporated by reference.

What is claimed is:

1. An AGC circuit comprising:
   a gain control circuit for controlling a gain for a reception signal from an antenna based on a gain control signal;
   a mixer circuit for multiplying an output signal from said gain control circuit by a prescribed local oscillation frequency signal to perform frequency conversion of said output signal;
   local oscillation circuits for generating local oscillation frequency signals of at least two different frequencies and supplying one of said local oscillation frequency signals to said mixer circuit;
   a frequency characteristic correction circuit connected to an output end of said mixer circuit for correcting a frequency characteristic of a signal path from said antenna to the output end of said mixer circuit in a prescribed frequency band including the frequency of an antenna output signal;
   a detection signal generation circuit for generating a detection signal representing a signal level of a signal that passed through said frequency characteristic correction circuit; and
   a gain control signal generation circuit for generating said gain control signal based on said detection signal and supplying said gain control signal to said gain control circuit.

2. The AGC circuit according to claim 1, wherein said frequency characteristic correction circuit has a frequency characteristic that is an inverse characteristic of a frequency characteristic of a signal path from said antenna up to said mixer circuit.

3. The AGC circuit according to claim 2, wherein said frequency characteristic correction circuit performs a correction operation that sets a prescribed interference wave signal included in said reception signal to a same signal level whichever local oscillation frequency signal is used for frequency conversion of said reception signal among said local oscillation frequency signals having different frequencies.

4. The AGC circuit according to claim 1, wherein said frequency characteristic correction circuit performs a correction operation that sets a prescribed interference wave signal included in said reception signal to a same signal level whichever local oscillation frequency signal is used for frequency conversion of said reception signal among said local oscillation frequency signals having different frequencies.

5. The AGC circuit according to claim 1, wherein said frequency characteristic correction circuit has one fixed frequency characteristic.

6. The AGC circuit according to claim 1, wherein said frequency characteristic correction circuit is a trap circuit having a prescribed trap frequency.

7. An AGC circuit comprising:
a first gain control circuit for controlling a first gain of a first reception signal from a first antenna based on a gain control signal;
a first mixer circuit for multiplying a first output signal from said first gain control circuit by a prescribed local oscillation frequency signal to perform frequency conversion of said first output signal;
a second gain control circuit for controlling a second gain of a second reception signal from a second antenna based on said gain control signal;
a second mixer circuit for multiplying a second output signal from said second gain control circuit by said prescribed local oscillation frequency signal to perform frequency conversion of said second output signal;
local oscillation circuits for generating local oscillation frequency signals of at least two different frequencies and supplying one of said local oscillation frequency signals to said first and second mixer circuits;
a frequency characteristic correction circuit connected to an output end of said first mixer circuit for correcting a frequency characteristic of a signal path from said first antenna to the output end of said first mixer circuit in a prescribed frequency band including the frequency of an antenna output signal;
a detection signal generation circuit for generating a detection signal representing a signal level of a signal that has passed through said frequency characteristic correction circuit; and
a gain control signal generation circuit for generating said gain control signal based on said detection signal and supplying said gain control signal to said first and second gain control circuits.

8. The AGC circuit according to claim 7, wherein said frequency characteristic correction circuit has a frequency characteristic that is an inverse characteristic of a frequency characteristic of a signal path from said first antenna up to said first mixer circuit.

9. The AGC circuit according to claim 8, wherein said frequency characteristic correction circuit performs a correction operation that sets a prescribed interference wave signal included in said reception signal to a same signal level whichever local oscillation frequency signal is used for frequency conversion of said reception signal among said local oscillation frequency signals having different frequencies.

10. The AGC circuit according to claim 7, wherein said frequency characteristic correction circuit performs a correction operation that sets a prescribed interference wave signal included in said reception signal to a same signal level whichever local oscillation frequency signal is used for frequency conversion of said reception signal among said local oscillation frequency signals having different frequencies.

11. An AGC method comprising:
controlling a first gain of a first reception signal from a first antenna based on a gain control signal;
multiplying a first output signal obtained by said controlling of said first gain of said first reception signal by a prescribed local oscillation frequency signal to perform frequency conversion of said first output signal;
controlling a second gain of a second reception signal from a second antenna based on said gain control signal;
multiplying a second output signal obtained by said controlling of said second gain of said second reception signal by said prescribed local oscillation frequency signal to perform frequency conversion of said second output signal;
generating local oscillation frequency signals of at least two different frequencies and supplying one of said local oscillation frequency signals as said prescribed local oscillation signal;
correcting a frequency characteristic of an output signal obtained by said multiplication of said first output signal in a prescribed frequency band including the frequency of an antenna output signal;
generating a detection signal representing a signal level of a signal that has passed through said correcting of said frequency characteristic; and
generating said gain control signal based on said detection signal and supplying said gain control signal to said controlling of first and second gains, wherein said frequency characteristic correction performs a correction operation that sets a prescribed interference wave signal included in said reception signal to a same signal level whichever local oscillation frequency signal is used for frequency conversion of said first and second reception signals among said local oscillation frequency signals having different frequencies.

* * * * *